(12) United States Patent
Rhee

(10) Patent No.: US 11,662,022 B2
(45) Date of Patent: May 30, 2023

(54) SEALING APPARATUS CAPABLE OF ROTATIONAL MOTION

(71) Applicant: SEALINK CORP., Seoul (KR)

(72) Inventor: Hee Jang Rhee, Gunpo-si (KR)

(73) Assignee: SEALINK CORP., Seoul (KR)

( * ) Notice: Subject to any disclaimer, the term of this patent is extended or adjusted under 35 U.S.C. 154(b) by 342 days.

(21) Appl. No.: 16/998,147

(22) Filed: Aug. 20, 2020

(65) Prior Publication Data

US 2020/0378500 A1    Dec. 3, 2020

Related U.S. Application Data

(63) Continuation of application No. PCT/KR2019/002825, filed on Mar. 12, 2019.

(30) Foreign Application Priority Data

Mar. 14, 2018 (KR) .................. 10-2018-0029605
Apr. 23, 2018 (KR) .................. 10-2018-0046545

(51) Int. Cl.
*F16J 15/00* (2006.01)
*F16J 15/3248* (2016.01)
*F16J 15/3268* (2016.01)

(52) U.S. Cl.
CPC ......... *F16J 15/002* (2013.01); *F16J 15/3248* (2013.01); *F16J 15/3268* (2013.01); *F16J 15/006* (2013.01)

(58) Field of Classification Search
CPC ...... F16J 15/002; F16J 15/006; F16J 15/3245; F16J 15/3268; F16J 15/54; F16J 15/56
See application file for complete search history.

(56) References Cited

U.S. PATENT DOCUMENTS 5,975,254 A * 11/1999 Emilsson ............... B61H 15/00
                                                                 188/196 R
10,024,753 B2 * 7/2018 Rhee .................. G01M 3/2869
(Continued)

FOREIGN PATENT DOCUMENTS

EP         1274952 B1    7/2005
JP      2015132379 A    7/2015
(Continued)

OTHER PUBLICATIONS

KR 100756029 Machine Translation, espace.net, retrieved Sep. 20, 2022 (Year: 2007).*

(Continued)

*Primary Examiner* — Nicholas L Foster
(74) *Attorney, Agent, or Firm* — Dinsmore & Shohl LLP; Yongsok Choi, Esq.

(57) ABSTRACT

Provided is a sealing apparatus capable of linear and rotational motion including a housing; a hollow first shaft penetrating and coupled to the housing; a first sealing member provided between the housing and the first shaft to seal therebetween; a second shaft of which at least a part is inserted into the first shaft; a second sealing member provided between the first shaft and the second shaft to seal therebetween; and a third sealing member provided on either an inner circumferential surface of the first shaft or an outer circumferential surface of the second shaft.

3 Claims, 10 Drawing Sheets

(56) References Cited

U.S. PATENT DOCUMENTS

| | | | | |
|---|---|---|---|---|
| 2002/0153664 | A1* | 10/2002 | Schroeder | F16J 15/56 |
| | | | | 277/551 |
| 2009/0302548 | A1* | 12/2009 | Ramsay | F16J 15/3208 |
| | | | | 277/558 |
| 2017/0108399 | A1* | 4/2017 | Rhee | F16J 15/002 |
| 2017/0299061 | A1* | 10/2017 | Rhee | G01M 3/2853 |
| 2020/0355247 | A1* | 11/2020 | Rhee | C23C 16/45514 |

FOREIGN PATENT DOCUMENTS

| | | | |
|---|---|---|---|
| KR | 19980042707 A | | 8/1998 |
| KR | 20040089287 A | * | 10/2004 |
| KR | 100756029 B1 | | 9/2007 |
| KR | 1020120001481 A | | 1/2012 |

OTHER PUBLICATIONS

International Search Report of PCT/KR2019/002825 dated Jun. 13, 2019.

* cited by examiner

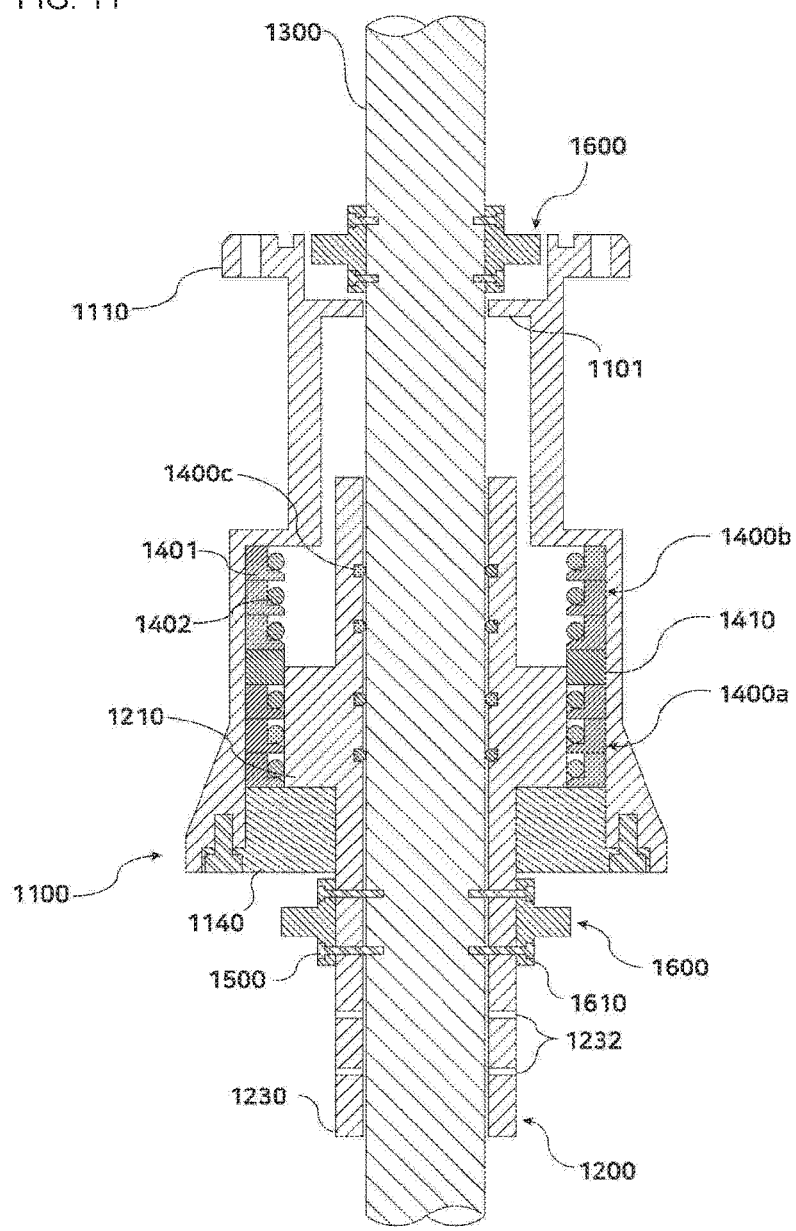

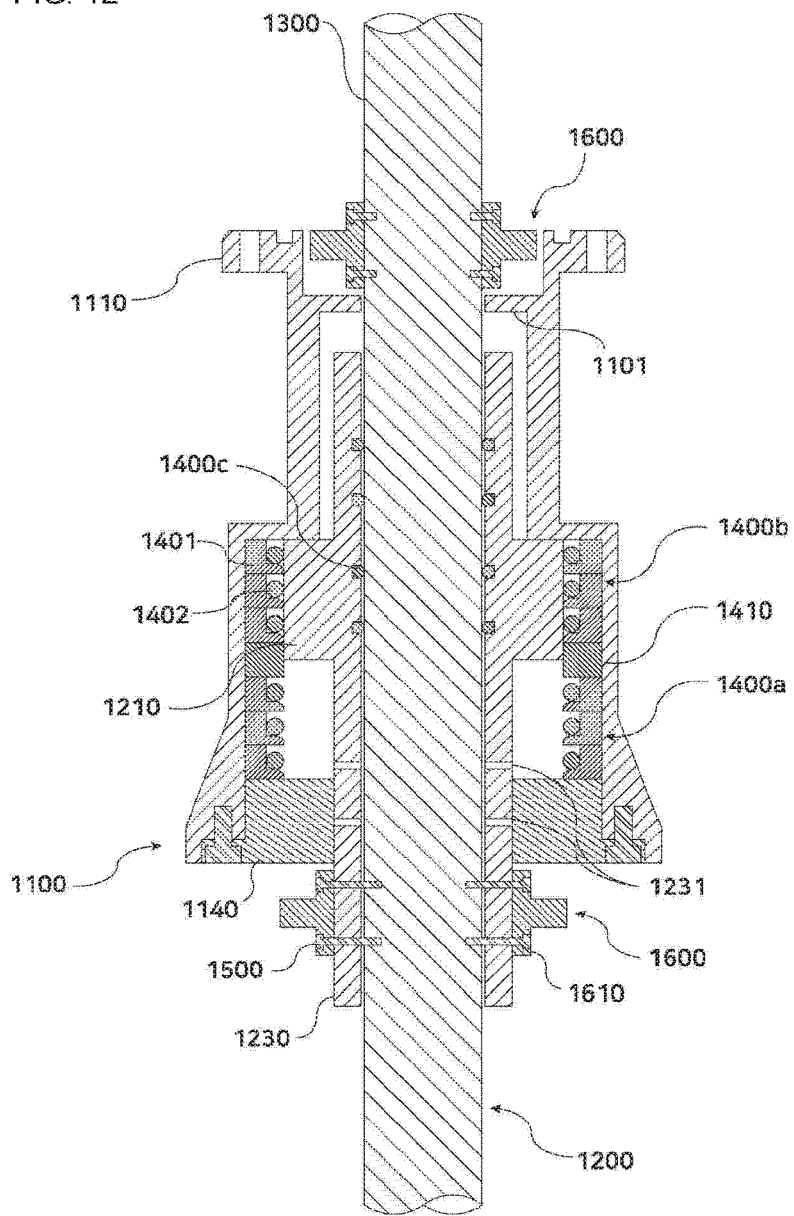

SEALING APPARATUS CAPABLE OF ROTATIONAL MOTION

CROSS-REFERENCE TO RELATED APPLICATIONS

This application is continuation of International Application No. PCT/KR2019/002825 filed on Mar. 12, 2019, which claims priority to Korean Patent Application No. 10-2018-0029605 filed on Mar. 14, 2018 and Korean Patent Application No. 10-2018-0046545 filed on Apr. 23, 2018, the entire contents of which are herein incorporated by reference.

TECHNICAL FIELD

The present disclosure relates to a sealing apparatus capable of rotational motion. More specifically, the present disclosure relates to a sealing apparatus capable of rotational motion, which is provided on a mechanical element having a rotating shaft that is applied to a chemical vapor deposition (CVD) or an atomic layer deposition (ALD), which is a process of depositing particles formed by chemical reactions between gases on a wafer surface to form an insulating film or a conductive film, an ion implantation process, an OLED, and an etching process to enable rotational motion of a shaft, prevents fluid leakage between the shaft and a housing which is a fixed body, and allows a prepared preparatory sealing member to be used when replacement is required due to wear or damage of the sealing member.

BACKGROUND ART

In general, a sealing apparatus capable of linear and rotational motion for vacuum pressure equipment is provided on the outer circumferential surface of a shaft that faces a high pressure region and a low pressure region and is capable of linear and rotational motion therebetween such that the high pressure region and the low pressure region are sealed with each other.

FIG. 1 is a cross-sectional view showing a conventional sealing apparatus for vacuum pressure equipment. As shown in the figure, the conventional sealing apparatus 1 for vacuum pressure equipment may include a housing 10 and a shaft 20 penetrating and coupled to the housing 10. The shaft 20 faces a high pressure region and a low pressure region, and the housing 10 is located on the interface between these, that is, the high pressure region and the low pressure region. In addition, a bushing 30 and a seal 40 for sealing are provided between the housing 10 and the shaft 20. The bushing 30 is for reducing friction generated between the housing 10 and the shaft 20, and the seal 40 is for sealing between the housing 10 and the shaft 20. At this time, friction is generated between the shaft 20 and the seal 40, and a ceramic layer is coated on the surface of the shaft 20 to minimize the friction generated at this time. In addition, a plurality of seals 40 are provided to increase the sealing effect and are located on the upper and lower portions of the housing 10, respectively.

The shaft 20 is installed to be capable of rotational motion with respect to the housing 10. At this time, as the bushing 30 for reducing friction generated during the rotational motion of the shaft 20, a ball bushing provided with a plurality of balls therein, or a slide bushing provided with a solid lubricant therein is used.

However, the conventional sealing apparatus 1 for vacuum pressure equipment having the above-described configuration has the disadvantage that only rotational motion or linear motion is possible, and when rotational motion and linear motion are performed simultaneously, the seal 40 also performs sealing with respect to rotational motion and sealing with respect to linear motion in parallel. When rotational motion and linear motion are performed simultaneously, the seal 40 is easily damaged, which has the disadvantage of a short life and frequent replacement.

Meanwhile, the shaft 20 is installed to be capable of rotational motion with respect to the housing 10. At this time, as the bushing 30 for reducing friction generated during the rotational motion of the shaft 20, a ball bushing provided with a plurality of balls therein, or a slide bushing provided with a solid lubricant therein is used.

However, the conventional sealing apparatus 1 for vacuum pressure equipment having the above-described configuration has the disadvantage that the seal 40 is easily damaged and has a short life which causes frequent replacement. In addition, there is a problem that the shaft 20 separates from the housing 10.

SUMMARY

Technical Problem

Provided are a sealing apparatus capable of rotational motion for vacuum pressure equipment, which may prevent a fluid from leaking between a shaft and a housing that is a fixed body while the shaft performs the rotational motion.

Provided also is a sealing apparatus capable of linear and rotational motion for vacuum pressure equipment, which may prevent a fluid from leaking between a shaft and a housing that is a fixed body while the shaft performs the linear and rotational motion simultaneously.

Provided also is a sealing apparatus capable of linear and rotational motion, which may replace a sealing member with another newly prepared preparatory sealing member by moving a shaft in the axial direction when the sealing member for sealing the rotational motion is damaged.

Provided also is a sealing apparatus capable of linear and rotational motion, which may replace a sealing member with another newly prepared preparatory sealing member by moving a shaft in the axial direction when the sealing member for sealing the rotational motion is damaged.

Provided also is a sealing apparatus capable of rotational motion, which may prevent a shaft that transfers the rotational motion from separating from a housing.

Solution to Problem

According to an aspect of the present disclosure, a sealing apparatus capable of linear and rotational motion includes a housing; a hollow first shaft penetrating and coupled to the housing; a first sealing member provided between the housing and the first shaft to seal therebetween; a second shaft of which at least a part is inserted into the first shaft; a second sealing member provided between the first shaft and the second shaft to seal therebetween; and a third sealing member provided on either an inner circumferential surface of the first shaft or an outer circumferential surface of the second shaft, wherein the first shaft is installed to be capable of only linear motion in an axial direction with respect to the housing, and the second shaft is installed to be capable of both rotational motion and linear motion with respect to the first shaft, and wherein the third sealing member does not perform sealing between the first shaft and the second shaft when the second shaft is in a first position in the first shaft, and performs sealing between the first shaft and the second shaft when the second shaft moves to and is in a second position in the first shaft.

The first sealing member may be a linear seal for linear motion, the second sealing member may be a rotational seal for rotational motion, and the third sealing member may be a rotational seal for rotational motion.

A projection extending in the axial direction may be formed on any one of the inner circumferential surface of the housing and the outer circumferential surface of the first shaft, and a groove into which the projection is inserted may be formed in the other one.

A bushing may be provided between the housing and the first shaft, and a bushing or a radial bearing may be provided between the first shaft and the second shaft.

The first shaft may be formed in a multistep in which an inner diameter increases toward one end portion or the second shaft may be formed in a multistep in which an outer diameter decreases toward one end portion, and the bushing or the radial bearing may be provided between the one end portion of the first shaft and the one end portion of the second shaft.

Locking protrusions may be spaced apart from each other by a predetermined distance in the axial direction and respectively formed on the inner circumferential surface of the housing and the outer circumferential surface of the first shaft such that linear motion therebetween in the axial direction is restricted by a predetermined distance.

The third sealing member may be provided on the inner circumferential surface of the first shaft, and a groove portion may be provided in the second shaft to form a predetermined gap with the inner circumferential surface of the third sealing member such that in the first position, the third sealing member does not seal between the first shaft and the second shaft, and in the second position, the third sealing member seals between the first shaft and the second shaft.

The third sealing member may be provided on the outer circumferential surface of the first shaft, and a groove portion may be provided in the first shaft to form a predetermined gap with the outer circumferential surface of the third sealing member such that in the first position, the third sealing member does not seal between the first shaft and the second shaft, and in the second position, the third sealing member seals between the first shaft and the second shaft.

According to an aspect of the present disclosure, a sealing apparatus capable of linear and rotational motion includes a housing; a hollow first shaft penetrating and coupled to the housing; a first sealing member provided between the housing and the first shaft to seal therebetween; a second shaft of which at least a part is inserted into the first shaft; a second sealing member provided between the first shaft and the second shaft to seal therebetween; and a third sealing member provided on either an inner circumferential surface of the housing or an outer circumferential surface of the first shaft, wherein the first shaft is installed to be capable of rotational motion with respect to the housing, and the second shaft is installed to be capable of linear motion in an axial direction with respect to the first shaft, and wherein the third sealing member does not perform sealing between the first shaft and the housing when the first shaft is in a first position in the housing, and performs sealing between the first shaft and the housing when the first shaft moves to and is in a second position in the housing.

The first sealing member may be a rotational seal for rotational motion, the second sealing member may be a linear seal for linear motion, and the third sealing member may be a rotational seal for rotational motion.

A projection extending in the axial direction may be formed on any one of the inner circumferential surface of the first shaft and the outer circumferential surface of the second shaft, and a groove into which the projection is inserted may be formed in the other one.

A bushing or a radial bearing may be provided between the housing and the first shaft, and a bushing may be provided between the first shaft and the second shaft.

Locking protrusions may be spaced apart from each other by a predetermined distance in the axial direction and respectively formed on the inner circumferential surface of the first shaft and the outer circumferential surface of the second shaft such that linear motion therebetween in the axial direction is restricted by a predetermined distance.

The third sealing member may be provided on the inner circumferential surface of the housing, and a groove portion may be provided in the first shaft to form a predetermined gap with the inner circumferential surface of the third sealing member such that in the first position, the third sealing member does not seal between the housing and the first shaft, and in the second position, the third sealing member seals between the housing and the first shaft.

The third sealing member may be provided on the outer circumferential surface of the first shaft, and a groove portion may be provided in the housing to form a predetermined gap with the outer circumferential surface of the third sealing member such that in the first position, the third sealing member does not seal between the housing and the first shaft, and in the second position, the third sealing member seals between the housing and the first shaft.

According to an aspect of the present disclosure, a sealing apparatus capable of rotational motion includes a hollow housing; a hollow first shaft of which a part is inserted into the housing and installed to be capable of rotational motion and motion in an axial direction with respect to the housing; a second shaft penetrating the first shaft and rotating along with the first shaft; and a first sealing member and a second sealing member provided between the housing and the first shaft to seal therebetween, wherein the first shaft is movable to a first position and a second position in the axial direction in the housing, and wherein the first sealing member seals between the housing and the first shaft when the first shaft is disposed in the first position in the housing, and the second sealing member seals between the housing and the first shaft when the first shaft is disposed in the second position in the housing.

The first sealing member and the second sealing member may be installed to be spaced apart from each other in the axial direction.

A separation adjusting member may be interposed between the first sealing member and the second sealing member.

The first shaft may include a protrusion portion having a step and extending, when the first shaft is disposed in the first position, the first sealing member may seal between the protrusion portion and the housing, and when the first shaft is disposed in the second position, the second sealing member may seal between the protrusion portion and the housing.

A part of the housing may be formed in a multistep in which an inner diameter increases toward one end, and a movement of the first shaft may be restricted in a first direction by a step between the protrusion portion and the housing.

The sealing apparatus capable of rotational motion may further include: a third sealing member provided between the first shaft and the second shaft to seal between the first shaft and the second shaft.

The first shaft and the second shaft may be coupled by a coupling means such that the first shaft and the second shaft rotate in the same way.

The coupling means may be a clamping tool or a screw bolt provided on the first shaft or the second shaft exposed to the outside of the housing.

The clamping tool may be attached to surround an outer circumferential surface of the first shaft to couple the first shaft and the second shaft, and the first shaft and the second shaft may be prevented from being detached from the housing by the clamping tool.

The sealing apparatus capable of rotational motion may further include: a separation preventing member configured to prevent a separation of the second shaft, and the separation preventing member may be coupled to the first shaft or the second shaft exposed to the outside of the housing.

The first shaft may include a first coupling portion and a second coupling portion by which the separation preventing member is coupled to the first shaft by coupling means, and the first coupling portion and the second coupling portion may be spaced apart in the axial direction of the first shaft.

When the separation preventing member is coupled to the first coupling portion, the first shaft may be disposed in the first position, and when the separation preventing member is coupled to the second coupling portion, the first shaft may be disposed in the second position.

The first sealing member and the second sealing member may be rotational seals for rotational motion.

Advantageous Effects of Disclosure

The sealing apparatus capable of linear and rotational motion according to the present disclosure may include a pair of shafts to respectively perform linear and rotational motion and sealing members between a housing and a first shaft and between the first shaft and a second shaft to prevent a fluid from leaking therebetween.

In addition, the sealing apparatus capable of linear and rotational motion may replace a sealing member with another newly prepared preparatory sealing member by moving a shaft in the axial direction when the sealing member for sealing the rotational motion is damaged.

In addition, the sealing apparatus capable of rotational motion according to the present disclosure may include a pair of shafts to perform the rotational motion and sealing members between a housing and a first shaft and between the first shaft and a second shaft to prevent a fluid from leaking therebetween.

In addition, the sealing apparatus capable of rotational motion may replace a sealing member with another newly prepared preparatory sealing member by moving a shaft in the axial direction when the sealing member for sealing the rotational motion is damaged, which has the effect of increasing the life of the sealing apparatus capable of rotational motion.

In addition, it is possible to prevent the shaft that transfers the rotational motion from separating from the housing through a separation preventing member.

BRIEF DESCRIPTION OF DRAWINGS

FIG. 11 is a cross-sectional view showing a first shaft of the sealing apparatus capable of rotational motion according to an embodiment of the present disclosure of FIG. 8 disposed in a first position.

FIG. 12 is a cross-sectional view showing the first shaft of the sealing apparatus capable of rotational motion according to an embodiment of the present disclosure of FIG. 8 disposed in a second position.

DETAILED DESCRIPTION

Figure 1:
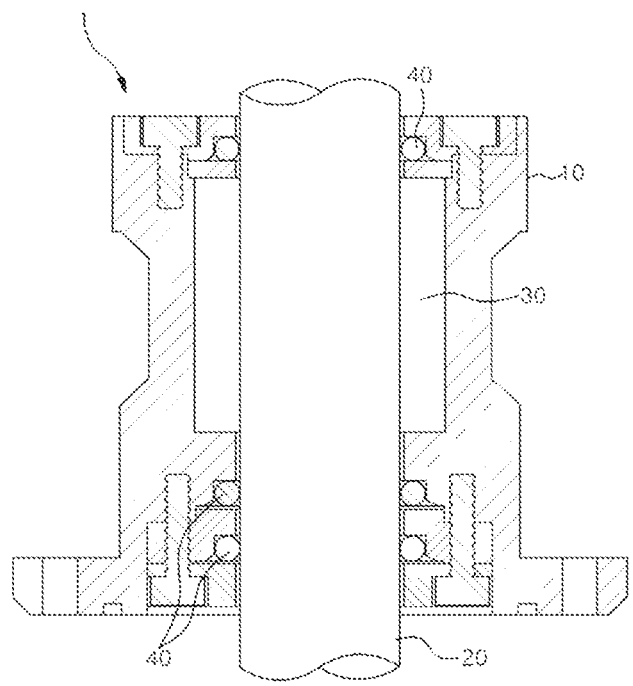
FIG. 1 is a cross-sectional view showing a conventional sealing apparatus.

The disclosure will now be described more fully with reference to the accompanying drawings, in which embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those of skill in the art. For clarity, portions that are not relevant to the description of the disclosure are omitted.

The terms used in the present specification are merely used to describe particular embodiments of the disclosure, and are not intended to limit the disclosure. An expression used in the singular encompasses the expression of the plural, unless it has a clearly different meaning in the context.

In the present specification, it is to be understood that the terms such as "including", "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In addition, the components shown in the embodiments of the present disclosure are shown independently to represent different characteristic functions, and do not mean that each component may include separate hardware or one software unit. That is, each component is described by listing each component for convenience of description, and at least two of the components may be combined to form one component, or one component may be divided into a plurality of components to perform a function. The integrated and separated embodiments of each of these components are also included within the scope of the present disclosure without departing from the spirit of the disclosure.

In addition, embodiments below are provided so that this disclosure will be thorough and complete, and will fully convey the concept of the disclosure to those skilled in the art. In the drawings, sizes and thicknesses of components may be exaggerated for clarity.

Hereinafter, the disclosure will be described in detail with reference to the attached drawings.

Figure 2:
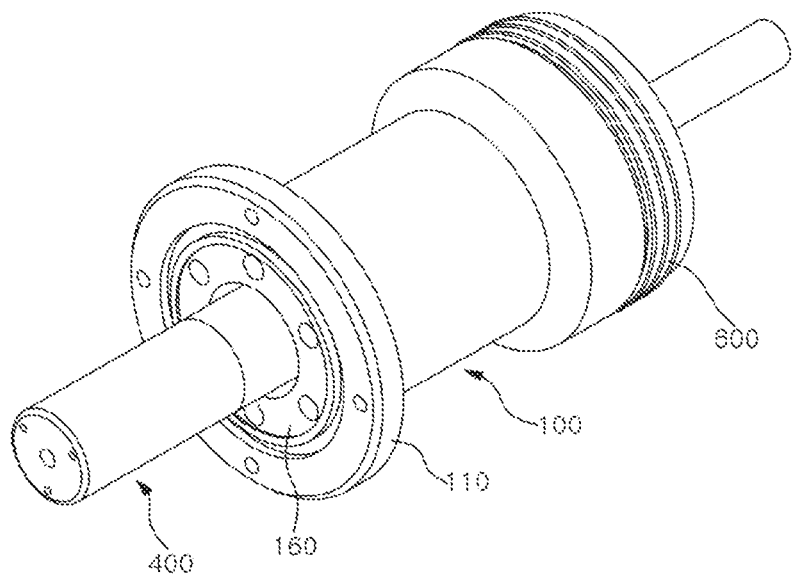
FIG. 2 is a perspective view showing a first embodiment of a sealing apparatus capable of linear and rotational motion according to the first embodiment of the present disclosure.
Figure 3:
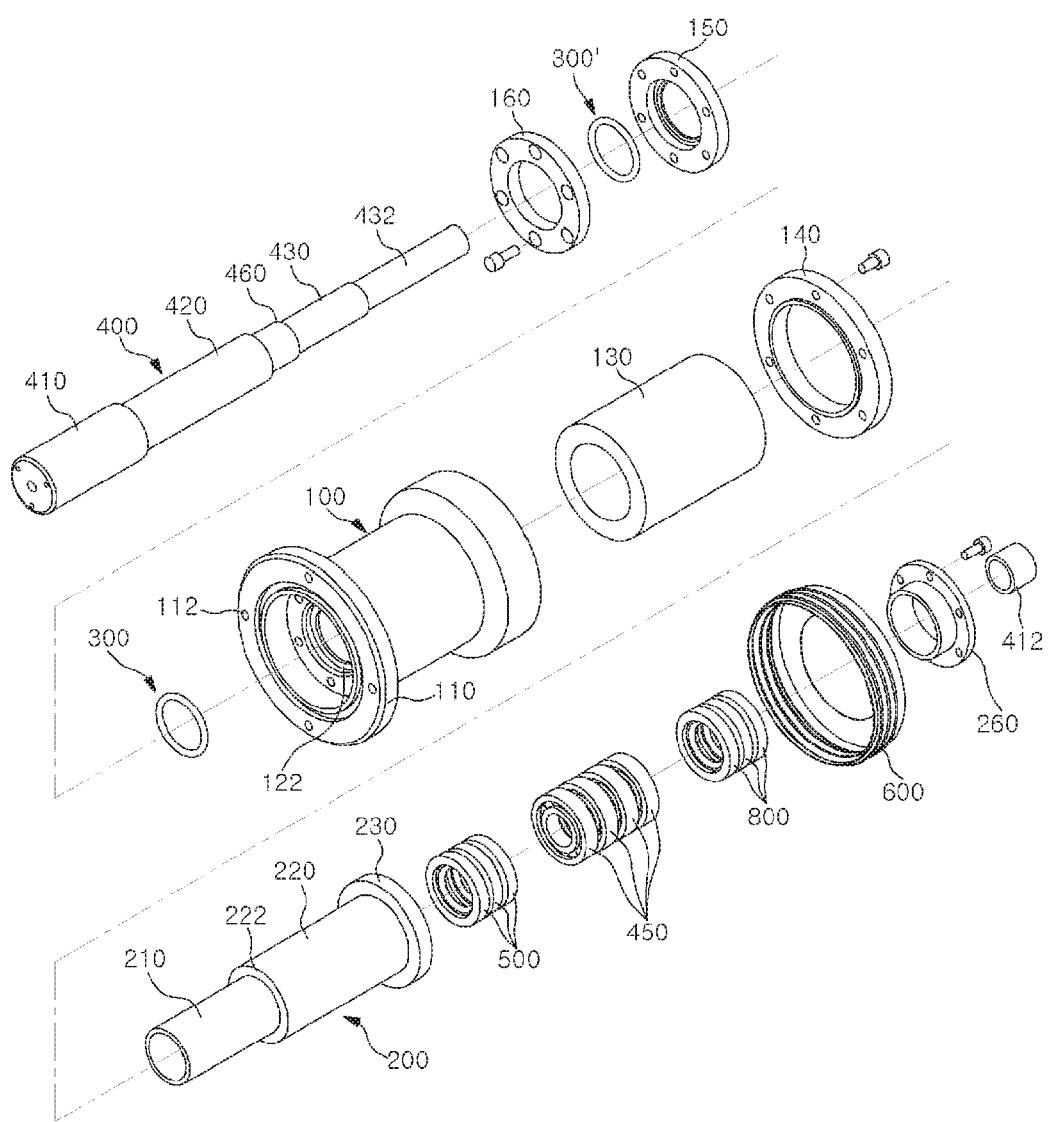
FIG. 3 is an exploded perspective view showing the sealing apparatus capable of linear and rotational motion of FIG. 2.
Figure 4:
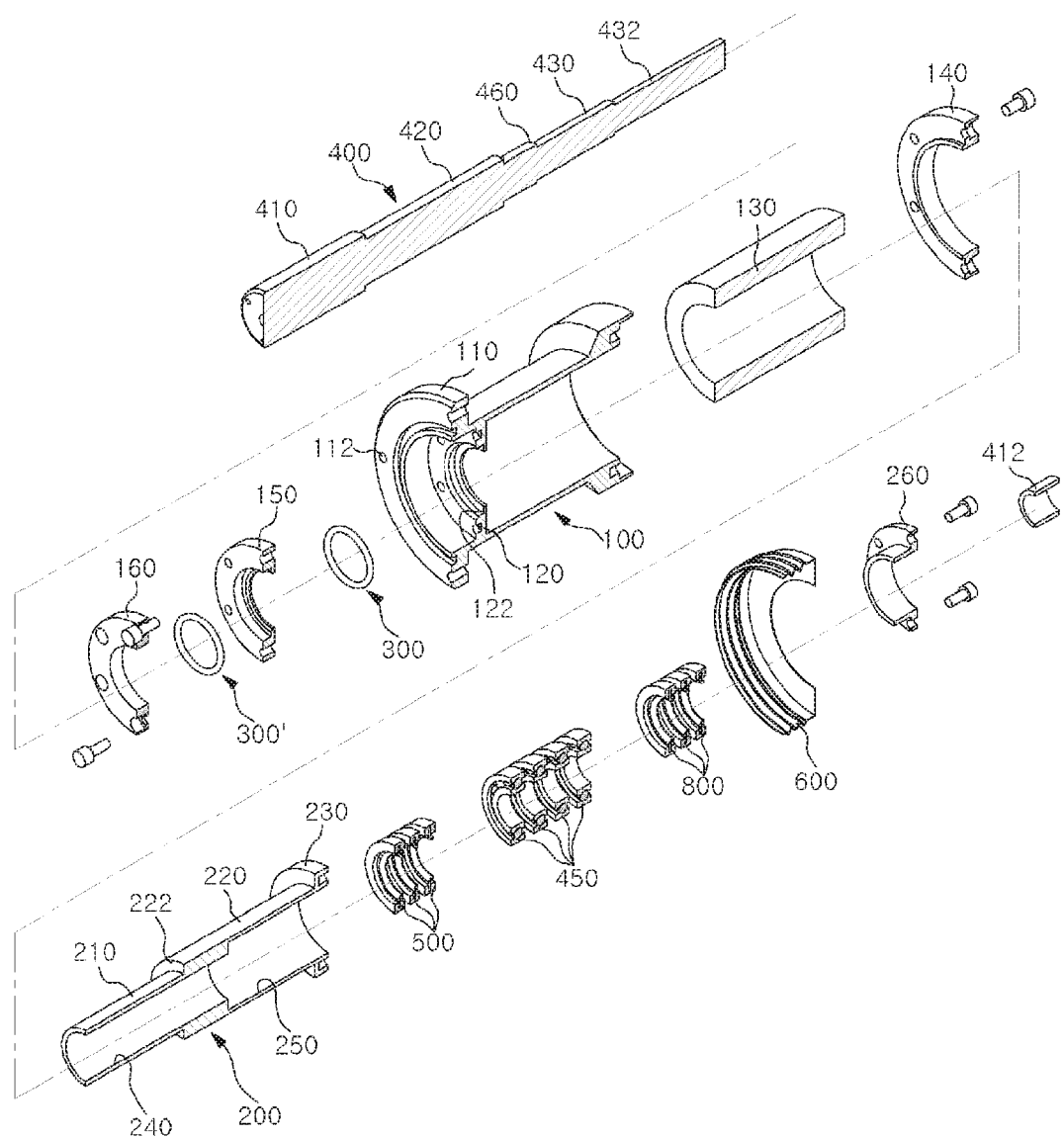
FIG. 4 is a partial cross-sectional perspective view showing the sealing apparatus capable of linear and rotational motion of FIG. 3.
Figure 5:
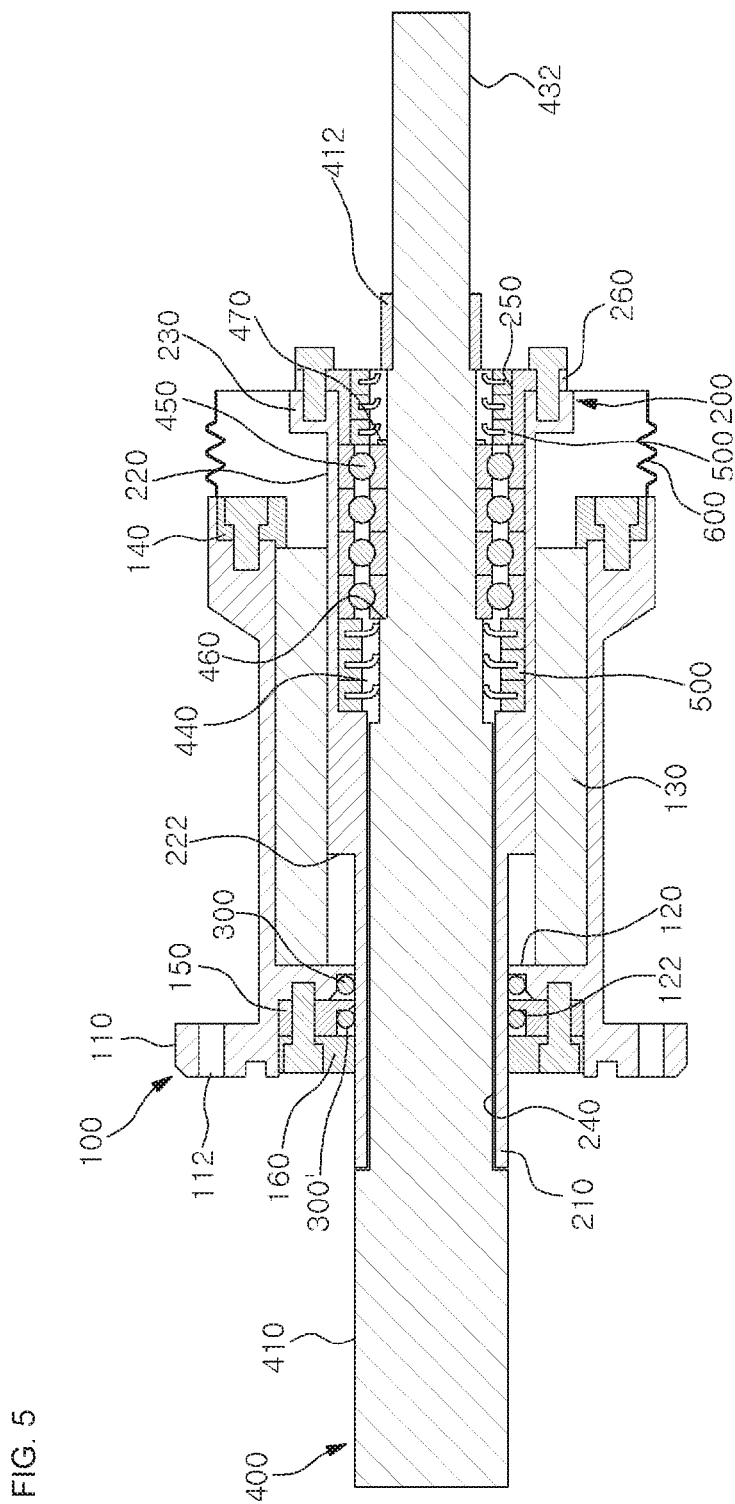
FIG. 5 is a cross-sectional view showing the sealing apparatus capable of linear and rotational motion of FIG. 2.
Figure 6:
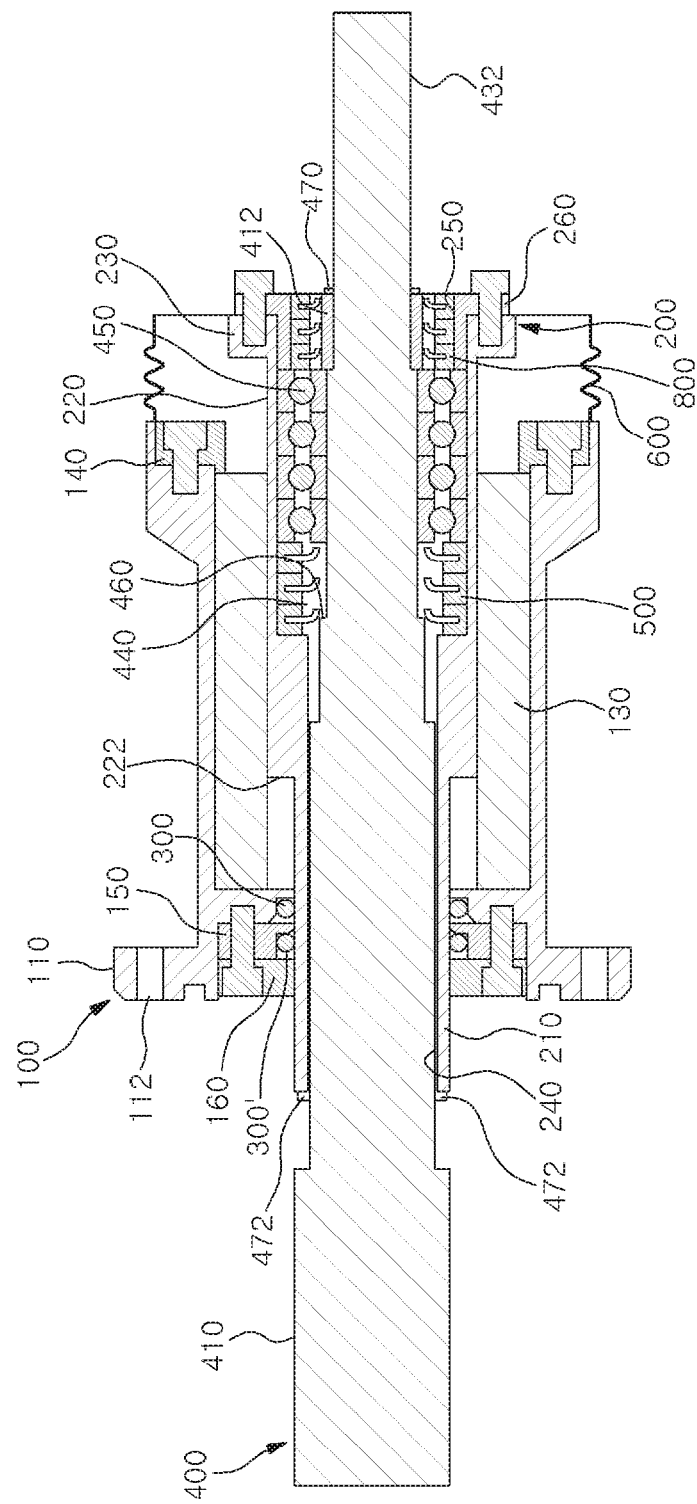
FIG. 6 is a cross-sectional view showing a state in which a second shaft is moved in the axial direction in the embodiment of FIG. 2.

FIG. 2 is a perspective view showing a first embodiment of a sealing apparatus capable of linear and rotational motion according to the first embodiment of the present disclosure, FIG. 3 is an exploded perspective view showing the sealing apparatus capable of linear and rotational motion of FIG. 2. FIG. 4 is a partial cross-sectional perspective view showing the sealing apparatus capable of linear and rotational motion of FIG. 3, and FIG. 5 is a cross-sectional view showing the sealing apparatus capable of linear and rotational motion of FIG. 2. FIG. 6 is a cross-sectional view showing a state in which a second shaft is moved in the axial direction in the embodiment of FIG. 2.

Referring to FIGS. 2 to 6, a sealing apparatus capable of linear and rotational motion according to an embodiment of the present disclosure may include a housing, a hollow first shaft penetrating and coupled to the housing, a first sealing member provided between the housing and the first shaft to seal therebetween, a second shaft of which at least a part is inserted into the first shaft, a second sealing member provided between the first shaft and the second shaft to seal therebetween, and a third sealing member provided on either the inner circumferential surface of the first shaft or the outer circumferential surface of the second shaft.

Here, the first shaft is installed to be capable of only linear motion in the axial direction, or to be capable of both rotational motion and linear motion in the axial direction with respect to the housing. Meanwhile, the second shaft may be installed to be capable of both rotational motion and linear motion in the axial direction, or to be capable of only linear motion in the axial direction with respect to the first shaft.

Of these, a case where the first shaft performs linear motion in the axial direction and the second shaft performs rotational motion and moves in the axial direction will be described as a first embodiment, and a case where the first shaft performs rotational motion and moves in the axial direction and the second shaft performs linear motion in the axial direction will be described as a second embodiment.

The illustrated first embodiment includes a housing 100, a hollow first shaft 200 penetrating and coupled to the housing 100, a first sealing member 300 provided between the housing 100 and the first shaft 200 to seal therebetween, a second shaft 400 of which at least a part is inserted into the first shaft 200, and a second sealing member 500 provided between the first shaft 200 and the second shaft 400 to seal therebetween.

The first shaft 200 is installed to be capable of linear motion in the axial direction with respect to the housing 100, and the second shaft 400 is installed to be capable of rotational motion and moves in the axial direction with respect to the first shaft 200.

The first embodiment will be described in more detail as follows.

The housing 100 is formed in a cylindrical shape having a flange 110 so as to be fixed to a boundary surface between a high pressure region and a low pressure region, and a locking protrusion 120 protruding inward is formed on one side of the inner circumferential surface of the housing 100. A plurality of screw holes 112 are formed in the flange 110 so as to be fixed to the boundary surface. In addition, a bushing 130 in a cylindrical shape may be provided inside the housing 100, and a housing cover 140 fixing the bushing 130 together with the locking protrusion 120 may be provided on the other end of the housing 100. The housing cover 140 is screwed to the other end of the housing 100. At this time, the bushing 130 is positioned such that both ends are in contact with the locking protrusion 120 and the housing cover 140, respectively, and is fixed by the housing cover 140 that is screwed. Further, the bushing 130 is for reducing friction between the housing 100 and the first shaft 200, and various types of bushings may be used, and a slide bushing provided with a solid lubricant therein may be used.

Meanwhile, one surface of the locking protrusion 120 may be formed in the multistep, and a first sealing member 300 may be provided on a step protrusion 122 of the multistep. A washer 150 that is inserted into the housing 100 and fixes the first sealing member 300 may be provided outside the locking protrusion 120. A step protrusion 152 of the multistep may be formed on one surface of the washer 150 and another first sealing member 300' may be provided on the step protrusion 152. In addition, a washer cover 160 for fixing the washer 150 and the other first sealing member 300' may be provided outside the washer 150.

The first sealing members 300 and 300' are for sealing between the housing 100 and the first shaft 200 and may be a linear seal for linear motion that exhibits excellent sealing performance for linear motion so as to be applicable to the first shaft 200 performing linear motion in the axial direction. In the present embodiment, an O-ring is used, but this is only an example, and the present disclosure is not limited thereto, and various types of linear seals such as a lip seal may be applied.

The first shaft 200 has a hollow shape and is formed in the multistep in which the outer diameter and the inner diameter increase from one end portion to the other portion. That is, the outer circumferential surface of the first shaft 200 may be formed in three steps including a small outer diameter portion 210, a middle outer diameter portion 220, and a large outer diameter portion 230 from one end portion. The inner circumferential surface of the first shaft 200 may be formed in two steps including a small inner diameter portion 240 and a large inner diameter portion 250 from one end portion.

The small outer diameter portion 210 of the first shaft 200 penetrates the locking protrusion 120, the washer 150, and the washer cover 160 and protrudes to one side, and the middle outer diameter portion 220 is located in contact with the bushing 130 provided to reduce friction with the housing 100 during linear motion of the first shaft 200. Meanwhile, the end portion of the large outer diameter portion 230, that is, the other end portion of the first shaft 200, is connected to the other end portion of the housing 100 by a flexible cover 600.

The first shaft 200 may perform linear motion in the axial direction along the bushing 130. When the first shaft 200 moves to one side, movement may be restricted because a step protrusion 222 formed between the small outer diameter portion 210 and the middle outer diameter portion 220 is locked on the locking protrusion 120. In addition, when the first shaft 200 moves to the other side, the movement may be restricted by the flexible cover 600.

The flexible cover 600 is for preventing foreign matters from being introduced between the housing and the other end portion of the first shaft 200, and may be expanded or contracted as the first shaft 200 moves in the axial direction. As the flexible cover, bellows of a synthetic resin material having elasticity such as rubber is most often used, and a flexible cover made of Teflon or stainless steel may be used according to the purpose of machine equipped with the sealing apparatus capable of linear and rotational motion for vacuum pressure equipment.

Meanwhile, since the first sealing member 300 provided between the housing 100 and the first shaft 200 is a linear seal for linear motion, when rotation occurs in the first shaft 200, the first sealing member 300 is undesirable because of loss of a function as the linear seal for linear motion.

Therefore, although not shown in the drawing, it is desirable that a projection extending in the axial direction is formed on any one of the inner circumferential surface of the housing 100 and the outer circumferential surface of the first shaft 200, and a groove into which the projection is inserted is formed in the other one such that the first shaft 200 does not rotate.

The second shaft 400 is formed in the multistep in which the outer diameter decreases from one end portion to the other portion. That is, the outer circumferential surface of the second shaft 400 is formed in four steps including a large outer diameter portion 410, a middle outer diameter portion 420, a first small outer diameter portion 430, and a second small outer diameter portion 432 from one end portion.

The middle outer diameter portion 420, the first small outer diameter portion 430, and the second small outer diameter portion 432 of the second shaft 400 penetrate and are coupled to the first shaft 200 from one side, and the large outer diameter portion 410 of the outer circumferential surface of the second shaft 400 is formed larger than the diameter of the small inner diameter portion 240 of the inner circumferential surface of the first shaft 200. A predetermined gap is formed between the middle outer diameter portion 420 of the second shaft 400 and the small inner diameter portion 240 of the first shaft 200 such that friction does not occur therebetween when the second shaft 400 rotates.

As described above, the inner diameter of the first shaft 200 increases toward the other side, and the outer diameter of the second shaft 400 decreases toward the other side, and thus a predetermined space 440 may be provided. A plurality of second sealing members 500 and radial bearings 450 may be positioned in the predetermined space 440 from one side. The second sealing member 500 is for sealing between the first shaft 200 and the second shaft 400, and the radial bearing 450 is for making the second shaft 400 rotatable with respect to the first shaft 200. In the present embodiment, the radial bearing 450 is provided to rotate the second shaft 400 with respect to the first shaft 200, but a bushing may be provided instead. Owing to the bushing, the second shaft 400 may rotate with respect to the first shaft 200.

Here, the second sealing member 500 is a rotational seal for rotational motion that exhibits excellent sealing performance for rotational motion to be applicable to the second shaft 400 performing rotational motion, and thus a lip seal is used in the present embodiment, but this is only an example and the present disclosure is not limited thereto, and various types of rotational seals may be applied.

Meanwhile, a step protrusion 460 and a snap ring 470 are provided on the outer circumferential surface of the second shaft 400 on both ends of the radial bearing 450, respectively, to fix the radial bearing 450. The snap ring 470 may be inserted into and fixed to the outer circumferential surface of the second shaft 400 after positioning the radial bearing in a detachable form. In addition, the radial bearing 450 may be fixed once more by a third sealing member 800 disposed adjacent thereto and a bearing cover 260 provided on the other end portion of the first shaft 200.

Meanwhile, the sealing apparatus capable of linear and rotational motion according to the present embodiment may include the third sealing member 800. Like the second sealing member 500, the third sealing member 800 may also be a rotational seal for rotational motion that exhibits excellent sealing performance for rotational motion to be applicable to the second shaft 400 performing rotational motion. In the present embodiment, a lip seal is used, but this is only an example, and the present disclosure is not limited thereto, and various types of rotational seals may be applied.

The third sealing member 800 may be provided on either the inner circumferential surface of the first shaft 200 or the outer circumferential surface of the second shaft 400, and in the present embodiment, the third sealing member 800 is provided on the inner circumferential surface of the first shaft 200 by way of an example. The third sealing member 800 is provided adjacent to the radial bearing 450. As shown in FIG. 5, when the second shaft 400 is in a first position in the first shaft 200, the inner circumferential surface of the third sealing member 800 is not in contact the outer circumferential surface of the second shaft 400. Therefore, in the first position, the third sealing member 800 does not perform sealing between the first shaft 200 and the second shaft 400. However, due to the long use of the sealing apparatus, the second sealing member 500 may end its life or be damaged. In this case, disassembling and reassembling the entire sealing apparatus to replace the second sealing member 500 may not be efficient. In this case, a user may remove the snap ring 470 and then push the second shaft 400 to one side (left in the present embodiment) within the first shaft 200 to move the second shaft 400 to a second position shown in FIG. 6.

As shown in FIG. 6, in the second position where the second shaft 400 is moved with respect to the first shaft 200, the inner circumferential surface of the third sealing member 800 may be in contact with the outer circumferential surface of the second shaft 400. As an example, the inner circumferential surface of the third sealing member 800 may contact a cylindrical ring 412 provided in the outer circumferential surface of the second shaft 400, such that sealing between the first shaft 200 and the second shaft 400 may be performed. A ring-shaped coupling ring provided separately on the second shaft 400 may be mounted on the cylindrical ring 412. Therefore, even when the endurance life of the second sealing member 500 is exhausted, without having to disassembling the entire sealing apparatus and replacing the second sealing member 500 and then reassembling the entire sealing apparatus, after removing only the snap ring 470 and by simply relocating the second shaft 400 within the first shaft 200, the third sealing member 800 may be used instead of the second sealing member 500. In this case, the other side of the large outer diameter portion 410 of the second shaft 400 and one side of the small inner diameter portion 240 of the first shaft 200 may be spaced in the axial direction. A snap ring 472 may be provided to prevent relative motion in the axial direction of the second shaft 400 and the first shaft 200 in the second position.

Meanwhile, the bearing cover 260 is provided on the other end of the first shaft 200, and the bearing cover 260 is for fixing the second sealing member 500, the radial bearing 450 and the third sealing member 800 that are provided inside the first shaft 200 and simultaneously for fixing the flexible cover 600.

The operation of the first embodiment configured as described above is as follows.

First, the operation of the sealing apparatus in the first position will be described with reference to FIG. 5.

Although not shown in the drawing, a driving apparatus for performing rotational motion and linear motion of the first shaft 200 and the second shaft 400 are provided in the other side of the sealing apparatus.

The second shaft 400 rotates by the driving apparatus. Since the radial bearing 450 is provided between the first shaft 200 and the other side of the second shaft 400 and a predetermined gap is formed on one side, the first shaft 200 does not rotate. In addition, as described above, when a projection (not shown) extending in the axial direction is form on any one of the inner circumferential surface of the housing 100 and the outer circumferential surface of the first shaft 200, and a groove (not shown) into which the projection is inserted is formed in the other one, the first shaft 200 may completely prevent rotation.

Meanwhile, the second shaft 400 may move in the axial direction by the driving apparatus. At this time, the axial movement of the second shaft 400 may be divided into two cases, when moving to one side and when moving to the other side.

Among these cases, when the second shaft 400 moves to one side, the snap ring 470 coupled to the outer circumferential surface of the second shaft 400 receives the force, and the force is transferred to the first shaft 200 through the third sealing member 800, the radial bearing 450, and the second sealing member 500, and thus the first shaft 200 performs linear motion along the bushing 130.

In addition, when the second shaft 400 moves to the other side, the large diameter portion of the second shaft 400 moves in contact with one end of the first shaft 200, and thus, as described above, the first shaft 200 performs linear motion along the bushing 130.

At this time, the rotational motion and the linear motion are simultaneously performed, and the radial bearing 450 is provided between the first shaft 200 and the second shaft 400, and the projection extending in the axial direction and the groove are provided between the inner circumferential surface of the housing 100 and the outer circumferential surface of the first shaft 200, and thus the first shaft 200 performs linear motion only.

Here, at least one end portion (preferably both end portions) of the first shaft 200 and the second shaft 400 may be polished to have a high hardness and a precise surface. The purpose of polishing is to bring the contact stress distribution and the temperature distribution between the first shaft 200 and the second shaft 400 and the sealing members 300 and 500 into uniformity. As described above, when the first shaft 200 and the second shaft 400 are polished, the airtightness between the first shaft 200 and the second shaft and the sealing members 300 and 500 may be further secured.

With regard to such a polishing process of the shafts 200 and 400 in detail, a predetermined coating material is coated to the surface of at least one end portion of the shafts 200 and 400 processed by using a method such as mechanical and heat treatment to a certain thickness and then, the coated surface is polished to have a uniform thickness. At this time, the reason for polishing after coating as described above is that the coating thickness may be arbitrarily adjusted and the uniform coating thickness may be obtained. However, the present disclosure is not necessarily limited thereto, and it is also possible to perform a coating operation after polishing.

Next, with reference to FIG. 6, the operation of the sealing apparatus in the second position will be described.

When the second sealing member 500 performing sealing between the first shaft 200 and the second shaft 400 ends its life or is damaged, after the user removes the snap ring 470, the user may push the second shaft 400 to one side in the first shaft 200 to move the second shaft 400 to the second position shown in FIG. 6, and then remount the snap ring 470. In addition, the snap ring 472 may be mounted to prevent relative motion in the axial direction of the second shaft 400 and the first shaft 200 in the second position.

Although not shown in the drawing, a driving apparatus for performing rotational motion and linear motion of the first shaft 200 and the second shaft 400 are provided in the other side of the sealing apparatus.

The second shaft 400 rotates by the driving apparatus. Since the radial bearing 450 is provided between the first shaft 200 and the other side of the second shaft 400 and a predetermined gap is formed on one side, the first shaft 200 does not rotate. Meanwhile, the second shaft 400 may move in the axial direction by the driving apparatus. At this time, the axial movement of the second shaft 400 may be divided into two cases, when moving to one side and when moving to the other side.

Among these cases, when the second shaft 400 moves to one side, the snap ring 470 coupled to the outer circumferential surface of the second shaft 400 receives the force, and the force is transferred to the first shaft 200 through the third sealing member 800, the radial bearing 450, and the second sealing member 500, and thus the first shaft 200 performs linear motion along the bushing 130.

In addition, when the second shaft 400 moves to the other side, the snap ring 472 coupled to the second shaft 400 receives the force while contacting one end portion of the first shaft 200, and the force is transferred to the first shaft 200, and thus the first shaft 200 performs linear motion along the bushing 130.

At this time, the rotational motion and the linear motion are simultaneously performed, and the radial bearing 450 is provided between the first shaft 200 and the second shaft 400, and the projection extending in the axial direction and the groove are provided between the inner circumferential surface of the housing 100 and the outer circumferential surface of the first shaft 200, and thus the first shaft 200 performs linear motion only.

Figure 7:
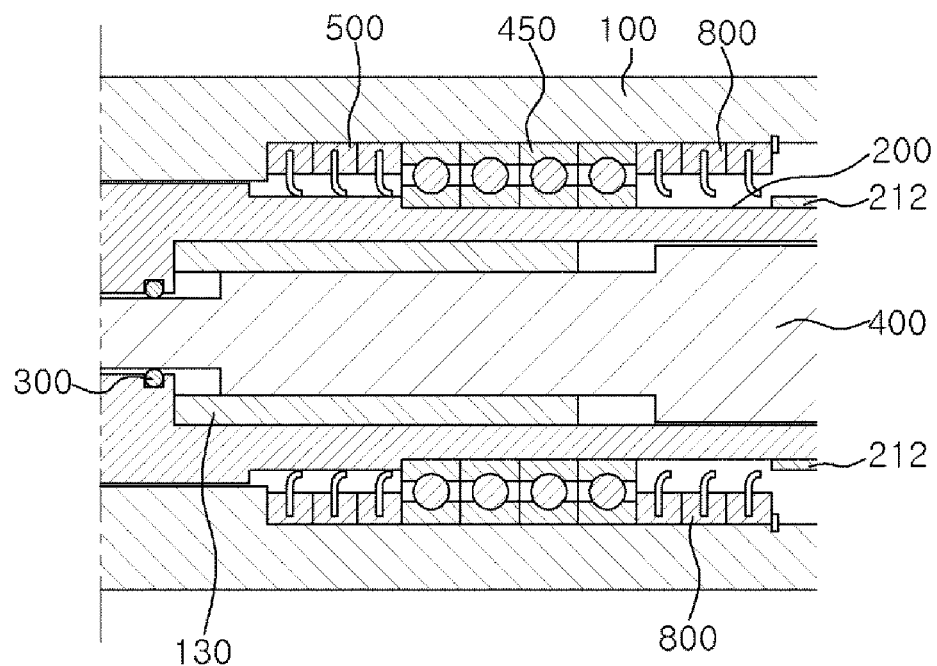
FIG. 7 is a cross-sectional view showing a sealing apparatus capable of linear and rotational motion according to a second embodiment of the present disclosure.

FIG. 7 is a cross-sectional view showing a sealing apparatus capable of linear and rotational motion according to a second embodiment of the present disclosure.

As shown in FIG. 7, in the second embodiment of the sealing apparatus capable of linear and rotational motion for vacuum pressure equipment, the radial bearing 450 is provided between the housing 100 and the first shaft 200 to allow the first shaft 200 to perform rotational motion, and the bushing 130 is provided between the first shaft 200 and the second shaft 400 to allow the second shaft 400 to perform linear motion. That is, the first shaft 200 is installed to enable rotational movement with respect to the housing 100, and the second shaft 400 is installed to enable axial linear movement with respect to the first shaft 200.

In addition, the second sealing member (a seal for rotation) 500 is provided between the housing 100 and the first shaft 200, and the first sealing member (a linear seal) 300 is provided between the first shaft 200 and the second shaft 400. At this time, as described above, an O-ring and a lip seal that exhibit excellent sealing performance for linear motion and rotational motion may be used as the sealing members 300 and 500 respectively.

In the second embodiment, as in the first embodiment, at least one end portion (preferably both end portions) of the first shaft 200 and the second shaft 400 may be polished by using a method such as heat treatment, plating and coating.

The second embodiment of the sealing apparatus capable of linear and rotational motion for vacuum pressure equipment configured as described above may obtain the same effect as the first embodiment. That is, a pair of shafts 200 and 400 are provided, and the shafts 200 and 400 perform linear motion and rotational motion, respectively, while the sealing members 300 and 500 that exhibit excellent sealing performance for linear motion and rotational motion are provided between the housing 100 and the first shaft 200 and between the first shaft 200 and the second shaft 400 to prevent a fluid from leaking therebetween.

Meanwhile, in the first embodiment and second embodiment, the O-ring and the lip seal respectively are examples of a pair of sealing members, that is, the first and second sealing members 300 and 500. However, as described above, the present disclosure is not necessarily limited thereto, and various types of sealing members may be applicable.

In addition, in the second embodiment, as in the first embodiment, the third sealing member 800 may be provided between the housing 100 and the first shaft 200. When the second sealing member 500 providing airtightness between the housing 100 and the first shaft 200 ends its life or is damaged, a user may move the first shaft 200 to one side in the housing 100 such that the third sealing member 800 may provide sealing between the housing 100 and the first shaft 200. In this case, the inner circumferential surface of the third sealing member 800 may contact a cylindrical ring 212 provided in the outer circumferential surface of the first shaft 200 such that sealing may be performed between the first shaft 200 and the housing 100. A ring-shaped coupling ring provided separately on the first shaft 200 may be mounted on the cylindrical ring 212.

As described above, the sealing apparatus capable of linear and rotational motion according to the embodiments of the present disclosure includes the pair of shafts to perform linear and rotational motion, respectively, and sealing members between the housing and the first shaft and between the first shaft and the second shaft to prevent the fluid from leaking therebetween.

In addition, a sealing member for rotational motion is additionally provided on either one of the first shaft and the second shaft (the first embodiment), or one of the housing and the first shaft (the second embodiment), and when the sealing member for rotational motion in use is damaged, the second shaft is moved with respect to the first shaft (the first embodiment), or the first shaft is moved with respect to the housing (the second embodiment), such that a new sealing member for rotational motion is disposed to a sealing possible position, and thus it is possible to extend the sealing effect with respect to rotational motion.

Hereinafter, a sealing apparatus capable of rotational motion according to an embodiment of the present disclosure will be described.

Figure 8:
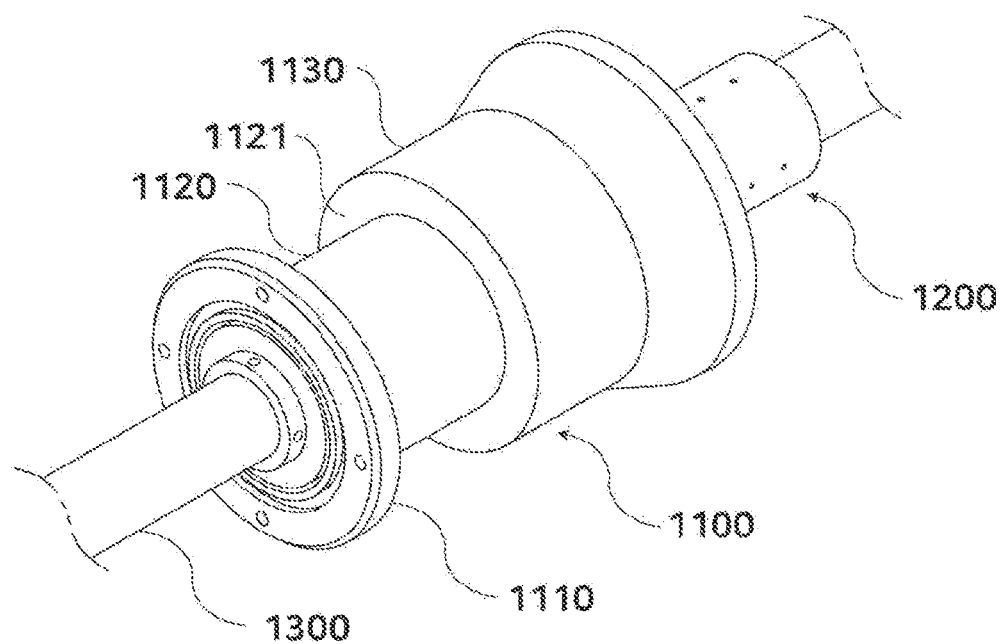
FIG. 8 is a perspective view showing a sealing apparatus capable of rotational motion according to an embodiment of the present disclosure.
Figure 9:
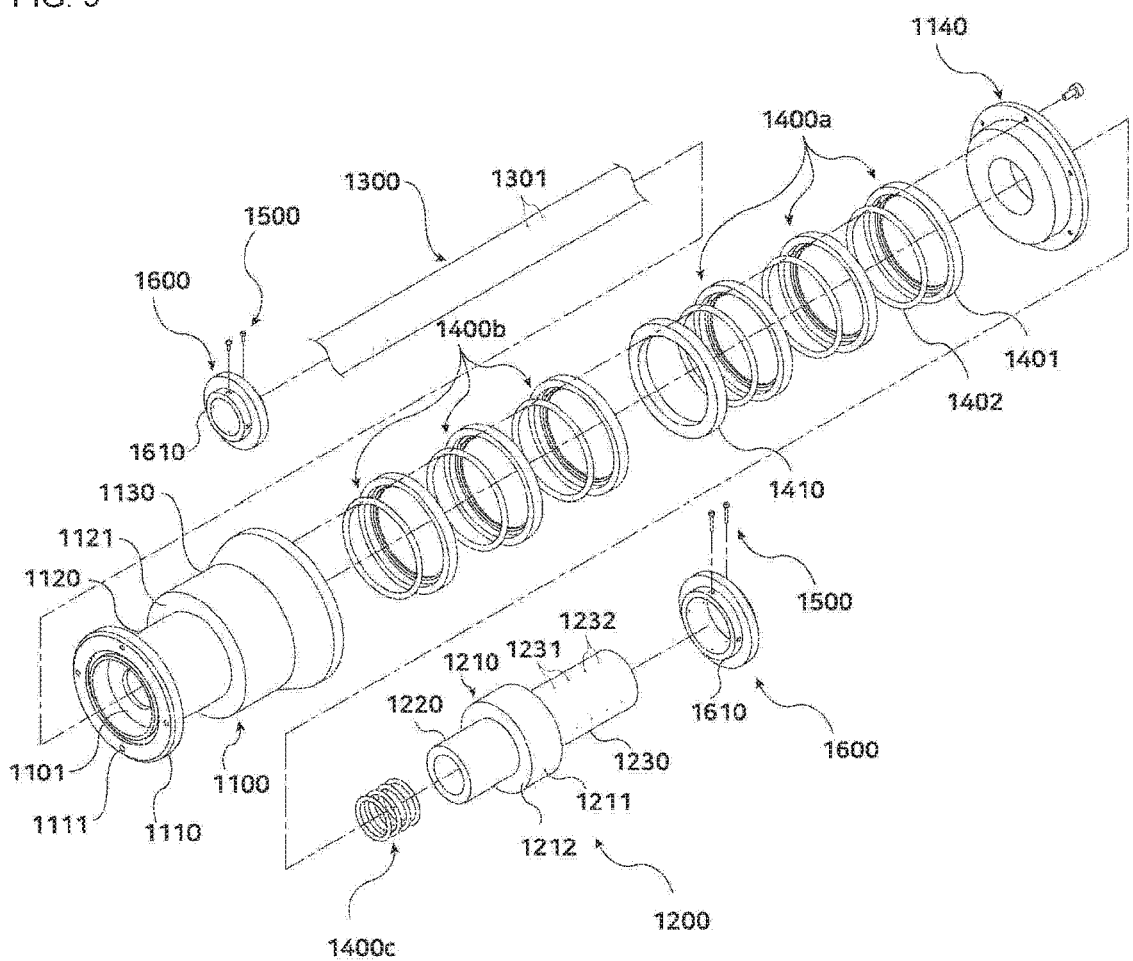
FIG. 9 is an exploded perspective view showing the sealing apparatus capable of rotational motion according to an embodiment of the present disclosure.
Figure 10:
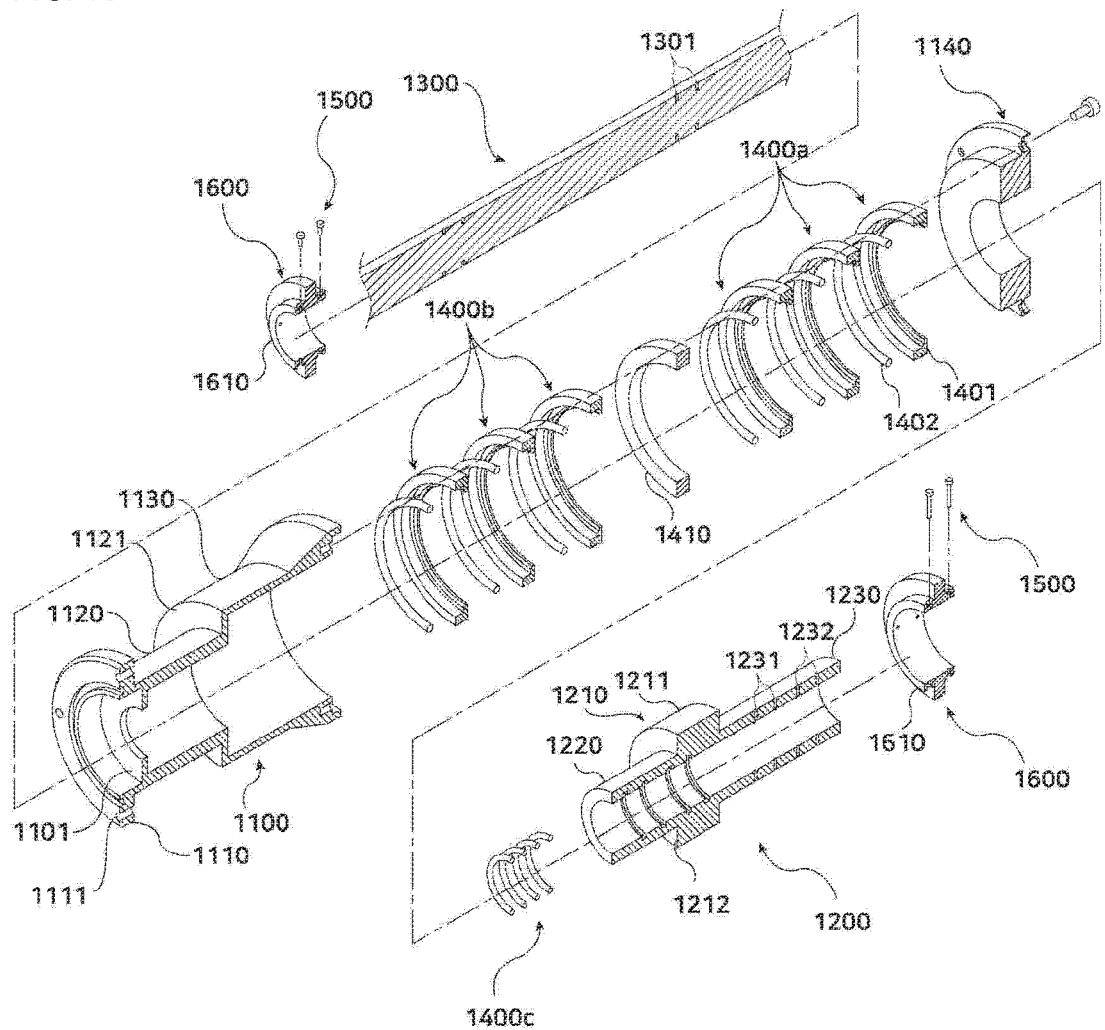
FIG. 10 is an exploded cross-sectional perspective view showing the sealing apparatus capable of rotational motion according to an embodiment of the present disclosure.

FIG. 8 is a perspective view showing a sealing apparatus capable of rotational motion according to an embodiment of the present disclosure, and FIG. 9 is an exploded perspective view showing the sealing apparatus capable of rotational motion according to an embodiment of the present disclosure. FIG. 10 is an exploded cross-sectional perspective view showing the sealing apparatus capable of rotational motion according to an embodiment of the present disclosure, and FIG. 11 is a cross-sectional view showing a first shaft of the sealing apparatus capable of rotational motion according to an embodiment of the present disclosure of FIG. 8 disposed in a first position. FIG. 12 is a cross-sectional view showing the first shaft of the sealing apparatus capable of rotational motion according to an embodiment of the present disclosure of FIG. 8 disposed in a second position.

Referring to FIGS. 8 to 12, the sealing apparatus capable of rotational motion according to an embodiment of the present disclosure may include a hollow housing 1100, a hollow first shaft 1200 of which a part is inserted into the housing 1100 and installed to be capable of rotational motion and motion in the axial direction with respect to the housing 1100, a second shaft 1300 penetrating the first shaft 1200 and rotating along with the first shaft 1200, and a first sealing member 1400a and a second sealing member 1400b provided between the housing 1100 and the first shaft 1200 to seal between the housing 1100 and the first shaft 1200.

Here, the first shaft 1200 is movable to the first position and the second position in the axial direction in the housing 1100, when the first shaft 1200 is disposed in the first position in the housing 1100 (see FIG. 11), the first sealing member 1400a may seal between the housing 1100 and the first shaft 1200, and when the first shaft 1200 is disposed in the second position in the housing 1100 (see FIG. 12), the second sealing member 1400b may seal between the housing 1100 and the first shaft 1200.

The first position is a position of the first shaft 1200 shown in FIG. 11 where a protrusion portion 1210 of the first shaft 1200 is in contact with the first sealing member 1400a, and a space between the first shaft 1200 and the housing 1100 is sealed. The second position is a position of the first shaft 1200 shown in FIG. 12 where the protrusion portion 1210 of the first shaft 1200 is in contact with the second sealing member 1400b, and the space between the first shaft 1200 and the housing 1100 is sealed.

The housing 1100 may be formed in a cylindrical shape having a flange portion 1110 so as to be fixed to a boundary surface between a high pressure region and a low pressure region, and a locking protrusion 1101 protruding inward may be formed on one side of the inner circumferential surface of the housing 1100. A plurality of screw holes 1111 are formed in the flange portion 1110 so as to be fixed to the boundary surface. As shown in FIGS. 11 and 12, the first sealing member 1400a and the second sealing member 1400b may be provided between the housing 1100 and the first shaft 1200, which is a space that may be generated when the first shaft 1200 penetrates the hollow of the housing 1100. The first sealing member 1400a and the second sealing member 1400b are for sealing between the housing 1100 and the first shaft 1200, and may be a rotating seal for rotational motion exhibiting excellent sealing performance for rotational movement. In the present embodiment, an O-ring is used, but this is only an example, and the present disclosure is not limited thereto, and various types of rotating seals such as a lip seal may be applied.

The housing 1100 may be formed in the multistep with an outer diameter increasing from one end to the other end, and a housing cover 1140 may be provided on the other end, and the housing 1100 and the housing cover 1140 may be coupled by a coupling means such as a screw.

Also, the first sealing member 1400a and the second sealing member 1400b may be installed to be spaced apart from each other in the axial direction. A gap adjusting member 1410 may be interposed between the spaced first sealing member 1400*a* and second sealing member 1400*b*. Due to the gap adjusting member 1410, the first sealing member 1400*a* and the second sealing member 1400*b* may be physically separated from each other. In addition, the first sealing member 1400*a* and the second sealing member 1400*b* may be fixed by the gap adjusting member 1410 so as not to move within the housing 1100.

Referring to FIGS. 9 and 10, each of a plurality of first sealing members 1400*a* and the second sealing members 1400*b* may be configured as a washer 1401 and a seal 1402. A step protrusion may be formed on one surface of the washer 1401 and the seal 1402 may be seated on the step protrusion.

Referring to FIGS. 11 and 12, the first sealing members 1400*a* and the second sealing members 400*b* each may be plural, and the gap adjusting member 1410 may be provided between the plurality of second sealing members 1400*b* and the plurality of first sealing members 1400*a* to fix the positions of the second sealing member 1400*b* and the first sealing member 1400*a* while separating the second sealing member 1400*b* and the first sealing member 1400*a*. A housing cover 1140 is provided on one end of the first sealing member 1400*a* to press the first sealing member 1400*a*, the second sealing member 1400*b*, and the gap adjusting member 1410, which are fitted side by side in the housing 1100. This structure has the advantage that the positions of the first sealing member 1400*a* and the second sealing member 1400*b* may be fixed in the housing even when the first sealing member 1400*a* and the second sealing member 1400*b* are not coupled to the housing 1100 by separate coupling means.

The first shaft 1200 may include a hollow formed therein and a step, and a protrusion portion 1210 formed to extend from the outer circumferential surface thereof. In the first position illustrated in FIG. 11, the first sealing member 1400*a* may seal between the protrusion portion 1210 and the housing 1100. The protrusion portion 1210 may include a protrusion portion outer diameter surface 1211 and a protrusion portion locking protrusion 1212 (see FIG. 10). The protrusion portion outer diameter surface 1211 and the first sealing member 1400*a* are in contact with each other to form sealing, thereby sealing between the housing 1100 and the first shaft 1200.

Meanwhile, as illustrated in FIG. 11, when the first shaft 1200 is disposed in the first position, the protrusion portion outer diameter surface 1211 of the first shaft 1200 does not contact the second sealing member 1400*b*. Therefore, in the first position, the second sealing member 1400*b* does not perform sealing between the housing 1100 and the first shaft 1200.

However, due to the long use of the sealing apparatus capable of rotational motion, the first sealing member 1400*a* may end its life or be damaged. In this case, disassembling and reassembling the entire sealing apparatus capable of rotational motion to replace the first sealing member 1400*a* may not be efficient. As a more efficient method, it is necessary to use a new sealing member without disassembling the entire sealing apparatus capable of rotational motion.

In the present embodiment, a user may grip the first shaft 1200 exposed to the outside of the housing 1100, for example, a second outer diameter portion 1230 of the first shaft, and then push the first shaft 1200 from the first position to the second position to move the first shaft 1200 to the second position shown in FIG. 12.

Then, as shown in FIG. 12, the first shaft 1200 may be disposed in the second position (the first shaft 1200 is moved in the axial direction from the first position in the housing 1100 and disposed in the second position), and the protrusion portion 1210 may also be disposed in the second position in the housing 1100.

In the second position, the protrusion portion 1210 of the first shaft 1200 may contact the second sealing member 1400*b* to seal the space between the first shaft 1200 and the housing 1100.

Accordingly, the sealing apparatus capable of rotational motion has the advantage of using the new second sealing member 1400*b* by moving the first shaft 1200 in the axial direction even when the first sealing member 1400*a* is damaged or ends its life.

Meanwhile, since the first shaft 1200 has a shape including the protrusion portion 1210, correspondingly, a part of the housing 1100 may be formed in the multistep with an inner diameter increasing toward one end. The housing 1100 according to an embodiment is formed in the multistep having a first outer diameter portion 1120 and a second outer diameter portion 1130, and a step protrusion 1121 may be formed due to a difference in the outer diameter between the first outer diameter portion 1120 and the second outer diameter portion 1130. When the first shaft 1200 moves from the first position to the second position, that is, when the user physically pushes and moves the first shaft 1200, since the locking protrusion 1212 of the protrusion portion 1210 of the first shaft 1200 is blocked by the step protrusion 1112, movement of the first shaft 1200 may be restricted. Such a structure may allow the first shaft 1200 to be disposed in the correct position of the second position when the first shaft 1200 moves from the first position to the second position.

In addition, the plurality of first sealing member 1400*a* and the second sealing member 1400*b* may be fitted into the housing 1100 along with the gap adjusting member 1410 side by side as described above because of the structure of the housing 1100 having the step protrusion 1121.

In addition, a third sealing member 1400*c* may be provided in a space of the hollow of the first shaft 1200 in which the second shaft 1300 may penetrate, that is, a space between the first shaft 1200 and the second shaft 1300. The third sealing member 1400*c* may seal between the first shaft 1200 and the second shaft 1300. The third sealing member 1400*c* may be an O-ring, but this is only an example and the present disclosure is not limited thereto, and various types of seals such as a lip seal may be applied.

In addition, when the first shaft 1200 and the second shaft 1300 are coupled by the coupling means 1500, and the first shaft 1200 rotates, the second shaft 1300 may also rotate in the same way.

Here, the coupling means 1500 may be a clamping mechanism or a screw bolt, but is not limited thereto, and various types of coupling means such as a screw or a pin may be applied.

Here, as an example, when a clamping tool is used as the coupling means 1500, the clamping tool may be attached to surround the outer circumferential surface of the first shaft 1200, compress the outer circumferential surfaces of the first shaft 1200 and the first shaft 1200, couple the first shaft 1200 and the second shaft 1300, and prevent the first shaft 1200 and the second shaft 1300 from being detached from the housing 1100 due to a step of the clamping tool generated by the coupling of the clamping tool. In addition, when moving the first shaft 1200 from the first position to the second position, the user may release the clamping tool and move the first shaft 1200 from the first position to the second position, and then again install the clamping tool in the first shaft 1200.

A separation preventing member 1600 may be used as the coupling means 1500. In the sealing apparatus capable of rotational motion, the separation preventing member 1600 may be coupled to the second outer diameter portion 1230 of the first shaft exposed to the outside of the housing 1100 to prevent the second shaft 1300 from being detached from the housing 1100.

To this end, a first coupling portion 1231 and a second coupling portion 1232 may be formed in the second outer diameter portion 1230 of the first shaft 1200. The first coupling portion 1231 and the second coupling portion 1232 may correspond to a coupling hole 1611 formed in the flange portion 1610 of the separation preventing member 1600. The first coupling portion 1231 and the coupling hole 1611 or the second coupling portion 1232 and the coupling hole 1611 corresponding to each other may be combined by the coupling means 1500, and accordingly the separation preventing member 1600 may be coupled to the first shaft 1200.

Meanwhile, referring to FIGS. 11 and 12, the separation preventing member 1600 may be coupled to the first shaft 1200 or the second shaft 1300 exposed to the outside of the housing 1100, and accordingly the coupled separation preventing member 1600 may prevent the first shaft 1200 or the second shaft 1300 from being detached from the housing 1100 due to another external force (e.g., gravity, etc.)

In addition, in a manner similar to that in which the separation preventing member 1600 is coupled to the first shaft 1200, a coupling portion 1301 to which the separation preventing member 1600 may be coupled may be formed in the second shaft 1300. The above-described second shaft 1300 and the separation preventing member 1600 may be coupled to the coupling portion 1301 and the coupling hole 1611 formed in the flange portion 1610 of the separation preventing member 1600 by the coupling means 1500.

In addition, the coupling hole 1611 of the flange portion 1610, the first coupling portion 1231 or the second coupling portion 1232 of the first shaft 1200, and the coupling portion 1301 of the second shaft 1300 may be coupled together by the coupling means 1500, and thus the separation preventing member 1600, the first shaft 1200 and the second shaft 1300 may be coupled together.

Here, when the coupling means 1500 is coupled to the first coupling portion 1231 of the first shaft 1200 such that the first shaft 1200 and the second shaft 1300 are coupled, the first shaft 1200 may be disposed in the first position, and when the coupling means 1500 is coupled to the second coupling portion 1232 of the first shaft 1200 such that the first shaft 1200 and the second shaft 1300 are coupled, the first shaft 1200 may be disposed in the second position.

Therefore, when the first sealing member 1400a ends its life or is damaged due to the long use of the sealing apparatus capable of rotational motion, the user may remove the coupling means 1500 fastened to the first coupling portion 1231 of the first shaft 1200 and the coupling portion 1301 of the second shaft 1300, move the first shaft 1200 from the first position to the second position, and then fasten the coupling means 1500 to the second coupling portion 1232 of the first shaft 1200 and the coupling portion 1301 of the second shaft 1300 again such that the first shaft 1200 may be fixed to the second position.

Owing to such a structure, it is not necessary to disassemble the entire sealing apparatus capable of rotational motion to replace the sealing member due to breakage and damage of the sealing members 1400a and 1400b inside the housing 1100, and the life of the apparatus may also extend twice.

In another embodiment, the first shaft 1200 and the second shaft 1300 may be coupled with a pin penetrating both the first shaft 1200 and the second shaft 1300 in a direction perpendicular to the axial direction of the shaft. In addition, a plurality of through holes (not shown) through which the pin may penetrate may be present in the first shaft capable of adjusting the coupling position of the first shaft 1200 and the second shaft 1300. Accordingly, the user may adjust the coupling position of the first shaft 1200 and the second shaft 1300 according to positions of the through holes and couple the first shaft 1200 and the second shaft 1300. In the present embodiment, when the first shaft 1200 is moved from the first position to the second position, only the pin coupling of the coupled first shaft 1200 and second shaft 1300 is disassembled, and after the first shaft 1200 is moved from the first position to the second position, the pin coupling may be performed again.

Although the present disclosure has been described with reference to the embodiment shown in the drawings, this is merely exemplary and will be understood by those of ordinary skill in the art that various modifications and equivalent other embodiments are possible. Therefore, the true technical protection scope of the present disclosure will be defined by the technical sprit of the appended claims.

The invention claimed is:

1. A sealing apparatus capable of linear and rotational motion comprising:
    a housing;
    a hollow first shaft penetrating and coupled to the housing;
    a first sealing member provided between the housing and the first shaft to seal therebetween;
    a second shaft of which at least a part is inserted into the first shaft;
    a second sealing member provided between the first shaft and the second shaft to seal therebetween; and
    a third sealing member provided on either an inner circumferential surface of the first shaft or an outer circumferential surface of the second shaft,
    wherein the first shaft is provided to be capable of linear motion in an axial direction with respect to the housing, and the second shaft is provided to be capable of rotational motion and linear motion with respect to the first shaft,
    wherein the second sealing member is a set of lip seals, wherein the third sealing member is a set of lip seals, and wherein the second and third sealing members are axially separated by a set of bearings, and
    wherein the third sealing member does not perform sealing between the first shaft and the second shaft when the second shaft is in a first position in the first shaft, and performs sealing between the first shaft and the second shaft when the second shaft moves to and is in a second position in the first shaft.

2. The sealing apparatus capable of linear and rotational motion of claim 1,
    wherein the first sealing member is a linear seal for linear motion, the second sealing member is a rotational seal for rotational motion, and the third sealing member is a rotational seal for rotational motion.

3. The sealing apparatus capable of linear and rotational motion of claim 1,
    wherein the third sealing member is provided on an inner circumferential surface of the first shaft, and a groove portion is provided in the second shaft to form a predetermined gap with an inner circumferential surface of the third sealing member such that in the first position, the third sealing member does not seal between the first shaft and the second shaft, and in the second position, the third sealing member seals between the first shaft and the second shaft.

* * * * *